US005589008A

United States Patent [19]

Keppner

[11] Patent Number: 5,589,008
[45] Date of Patent: Dec. 31, 1996

[54] PHOTOVOLTAIC CELL AND METHOD FOR FABRICATION OF SAID CELL

[75] Inventor: Herbert Keppner, Neuchatel, Switzerland

[73] Assignee: Universite De Neuchatel, Neuchatel, Canada

[21] Appl. No.: 446,628

[22] PCT Filed: Sep. 27, 1994

[86] PCT No.: PCT/CH94/00192

§ 371 Date: May 31, 1995

§ 102(e) Date: May 31, 1995

[87] PCT Pub. No.: WO95/10856

PCT Pub. Date: Apr. 20, 1995

[30] Foreign Application Priority Data

Oct. 11, 1993 [FR] France ..................... 93 12246

[51] Int. Cl.$^6$ ............................ H01L 31/06; H01L 31/18
[52] U.S. Cl. ...................... 136/259; 136/255; 136/256; 136/258; 136/261; 257/431; 257/436; 257/438; 427/74; 437/2
[58] Field of Search ...................... 136/255–256, 136/258 PC, 258 AM, 259, 261; 257/431, 436, 458; 427/74; 437/2

[56] References Cited

U.S. PATENT DOCUMENTS 5,213,628  5/1993  Noguchi et al. ............... 136/255

FOREIGN PATENT DOCUMENTS 4130671  5/1992  Japan ..................... 136/255
4192569  7/1992  Japan ..................... 136/255

OTHER PUBLICATIONS

11th EC Photovoltaic Solar Energy Conference, 12 Oct. 1992, Montreux, CH pp. 617–620—R. Fluckiger et al. 'Microcrystalline silicon prepared with the very high frequency glow discharge technique for p–i–n solar cell applications' see the whole document.

23rd IEEE Photovoltaic Specialists Conference, 10 May 1993, Louisville, USA pp. 839–844—R. Fluckiger et al. 'Preparation of undoped and doped microcrystalline silicon (uc–Si:H) by VHF–GD for p–i–n solar cells' see the whole document.

Japanese Journal of Applied Physics., vol. 31 PT. 1, No. 11, Nov. 1992, Tokyo JP—pp. 3518–3522—M. Tanaka et al. 'Development of new a–Si/c–Si heterojunction solar cells: ACJ–HIT (Artificially Constructed Junction–Heterojunction with Intrinsic Thin–Layer)'.

Progress in Photovoltaics: Research and Application, vol. 1, No. 2, Apr. 1993, Chichester, GB pp. 85–92—M. Tanaka et al. "Development of new heterojunction structure (ACJ–HIT) and its application to polycrystalline silicon solar cells".

23rd IEEE Photovoltaic Specialists Conference, 10 May 1993, Louisville, USA pp. 878–884—D. Fischer et al. "Amorphous silicon solar cells with graded low–level doped i–layers characterised by bifacial measurements".

11th E. C. Photovoltaic Solar Energy Conference, 12 Oct. 1992, Montreux, CH pp. 1057–1060—T. Takahama et al. "High efficiency single– and poly–crystalline silicon solar cells using ACJ–HIT structure".

*Primary Examiner*—Aaron Weisstuch
*Attorney, Agent, or Firm*—David and Bujold

[57] ABSTRACT

A photovoltaic cell (10) having a semiconductor substrate (11), a front passivation layer (12) arranged on the substrate, an emitter layer (14) having a first conductivity type (p or n), a front transparent conductive layer (15), a rear passivation layer (17) deposited on a rear surface of the substrate, a rear layer (18) producing a back surface field having a second conductivity type (n or p) opposite to the first conductivity type, as well as a reflecting element (19) comprised of a transparent conductive layer (20), an adhesion layer (21), and a reflecting layer (22). The disclosed cell has a substantially high efficiency a substantially low fabrication cost and is used in solar cells.

30 Claims, 1 Drawing Sheet

PHOTOVOLTAIC CELL AND METHOD FOR FABRICATION OF SAID CELL

FIELD OF THE INVENTION

The present invention relates to photovoltaic cells in general and, more particularly, to photovoltaic cells having a semi-conductor substrate, an emitter layer having a first conductivity type (p or n), a front passivation layer between the substrate and the emitter layer, a front transparent conductive layer, a rear passivation layer deposited on the rear surface of the substrate, and a reflective element comprising a rear transparent conductive layer, an adhesion layer and a reflective layer.

It also relates to a method for fabricating such a photovoltaic cell.

BACKGROUND OF THE INVENTION

The search for renewable energy sources which do not produce waste and are both ecologically acceptable and economically poses one of the greatest challenges of this era. One solution to the problem of providing "clean" energy is solar energy. Numerous types of solar energy collectors have been developed to transform solar energy into an energy form which is easier to store and transport, such as electrical energy, for example. Photovoltaic cells, currently called solar cells, function essentially according to the following principle: when a photon reaches a semi-conductor, it generates charge carriers by promoting electrons in the valence shell to the conduction shell and thus produces electron/hole pairs. Thus, an electromotive force is present on opposite sides of the junction and the semiconductor acts as an energy source.

Two methods of making such photovoltaic cells have been explored. One consists of using a crystalline material with high voltaic efficiency (greater than 10%) cut into plates. The other consists of depositing a thin layer of material with a lower efficiency (5% to 10%) on a large, inexpensive support (glass, stainless, plastic, etc.). This invention involves the former method.

Various methods have been developed for making photovoltaic cells from crystalline materials having high voltaic efficiency. However, these methods are not without shortcomings in terms of expensive fabrication costs and marginal outputs from the cells.

A first method of producing such cells consists of using thermal diffusion to dope a silicon substrate with an element such as boron or phosphorus at a temperature above 1,000° C. This high temperature treatment consumes much energy and thus is costly; additionally, when a thin substrate is used at such a high temperature, it tends to break or bend. Consequently, solar cells produced by this method are quite expensive.

Other procedures have been explored to overcome these disadvantages. One of these consists of replacing the doping process with the deposition of a doped layer at a lower temperature. This is accomplished by depositing a thin layer of amorphous silicon of p type conductivity on a crystalline silicon substrate of n type conductivity at a temperature of less than 200° C. Accordingly, a heterojunction of the type p/n is obtained. Since it takes place at a lower temperature, this procedure consumes relatively little energy. In addition, the lower temperature reduces cross-contamination of the charge carriers caused by diffusion of impurities from the treatment chamber, a fact which improves cell output. However, the output is still marginal, as cross-contamination is not entirely eliminated.

In an attempt to eliminate this phenomena altogether, a procedure has been devised whereby an intrinsic layer of amorphous silicon is deposited between the crystalline silicon layer having n type conductivity and the amorphous silicon layer having p type conductivity. This cell, known as ACJ-HIT (Artificially Constructed Junction-Heterojunction with Intrinsic Thin layer), is fabricated using a low temperature method and provides an efficient output, since there is no cross-contamination and the p/n type junction is abrupt.

Further attempts to increase photovoltaic cell efficiency have resulted in the development of semiconductive junctions on both substrate surfaces. To achieve this, the cell has a silicon substrate with p type conductivity, to which is added a front layer with n type conductivity and a silicon dioxide passivation layer ($SiO_2$). This cell is fabricated as follows: first, the silicon dioxide passivation layer is deposited on the rear surface of the substrate; then, a portion of this passivation layer is removed; and finally, the positive conductive layer is deposited, doped with boron, to form the rear contact by locally creating a back surface field. Using a silicon dioxide passivation layer necessarily implies the creation of non-passive zones to form the rear contact. While this method has achieved the maximum cell efficiency to date, it also has certain drawbacks. It is relatively difficult to diffuse the boron while simultaneously maintaining the stability of the charge carriers at an output sufficient to result in high cell efficiency. Furthermore, to achieve an effective junction, the boron diffusion must be substantial and therefore must occur over a fairly long period of time and at a high temperature. Therefore, the disadvantages described above in relation to high temperature treatment also limit the use of this method.

There is also a method wherein the optical path of light beams in a solar cell is increase while the cell is kept as thin as possible. This method consists of providing a transparent layer on the upper cell surface. This layer is textured so that the light beams reaching it perpendicular to the cell plane are deviated by refraction and traverse the cell where its thickness is not minimal. Yet another method which achieves the same result consists of using a textured substrate and depositing layers of essentially uniform thickness on the substrate.

SUMMARY OF THE INVENTION

The conclusion to be drawn from these known methods is that the ideal photovoltaic cell is one made from a particularly thin, inexpensive substrate, with the layers deposited at a low temperature and with minimal intervention during the deposition process, but which nevertheless achieves high efficiency. This object is accomplished by the present invention.

A photovoltaic cell according to the present invention has a rear passivation layer that covers the entire rear substrate surface. In addition, this passivation layer is covered with a rear layer producing a back surface field. The rear layer has a second conductivity type (n or p) that is the opposite of the first conductivity type of the emitter layer.

According to various embodiments, the semi-conductor substrate may have the second conductivity type (n or p), be intrinsic, or be compensated.

According to various embodiments, the semi-conductor may be made of single crystalline or polycrystalline silicon and may be from 50 μm to 150 μm thick, preferably 80 μm thick.

The emitter is formed of hydrogenated microcrystalline silicon or hydrogenated silicon carbide. It is from 20 Å to 500 Å thick, preferably 100 Å thick.

The front passivation layer is preferably made of amorphous hydrogenated intrinsic silicon ranging in thickness from 20 Å to 500 Å, preferably 80 Å thick.

According to one advantageous embodiment, the transparent conductive layer comprises zinc oxide (ZnO), preferably ranging in thickness from 500 Å to 5000 Å generally 1000 Å thick.

The rear passivation layer may be made of amorphous hydrogenated intrinsic silicon and may range in thickness from 20 Å to 500 Å, preferably 80 Å thick.

The rear layer which produces a back surface field is preferably made of hydrogenated microcrystalline silicon and ranges in thickness from 100 Å to 1000 Å, generally 300 Å thick.

According to an advantageous embodiment, the transparent rear conductive layer is made of heavily dope zinc oxide (ZnO) and ranges in thickness from 500 Å to 5000 Å, generally 2000 Å thick.

The adhesion layer on the reflective element is preferably a titanium (Ti) layer ranging in thickness from 10 Å A to 100 Å A, generally 15 Å thick, and the reflective element is a silver layer, preferably 2000 Å thick.

When the substrate is smooth, the front and rear transparent conductive layers of the cell may be textured.

On the other hand, when the substrate is textured, the front and rear transparent conductive layers may be of generally uniform thickness.

The method of fabricating a photovoltaic cell according to the invention includes the following steps:

a semi-conductive substrate is placed in a deposition chamber;

using plasma, at a deposition frequency ranging from 35 to 200 MHz, preferably 70 MHz, the following are deposited in succession: a front passivation layer, an emitter layer, a rear passivation layer, and a rear layer producing a back surface field;

using magnetron cathode sputtering at a radio frequency ranging from 1 to 100 MHz, preferably 13.56 MHz, a transparent front conductive layer and a transparent rear conductive layer are deposited; and an adhesion layer and a reflective layer are deposited on the transparent rear conductive layer.

According to a first variation of the method, the substrate, which is placed in the deposition chamber, has been previously subjected to a chemical treatment.

In a second variation of this method the substrate, which is placed in the deposition chamber, is an unfinished substrate which has been cut. The front and rear surfaces of the substrate are subjected to plasma at a frequency ranging from 1 to 200 MHz, preferably 70 MHz.

According to a first variation of the method, a textured, transparent conductive layer is deposited on a generally smooth substrate.

According to a second variation of the method, the substrate is treated with plasma at a frequency ranging from 1 to 200 Hz and layers of essentially uniform thickness are deposited on the textured substrate thus obtained.

This series of operations preferably takes place at a temperature ranging from 20° C. to 600° C., preferably ranging from 150° C. to 300° C.

The above and other features of the invention will now be more particularly described with reference to the accompanying drawings and pointed out in the claims. It will be understood that the particular photovoltaic cell embodying the invention is shown by way of illustration only and not as a limitation of the invention.

DETAILED DESCRIPTION OF THE INVENTION

Figure 1:
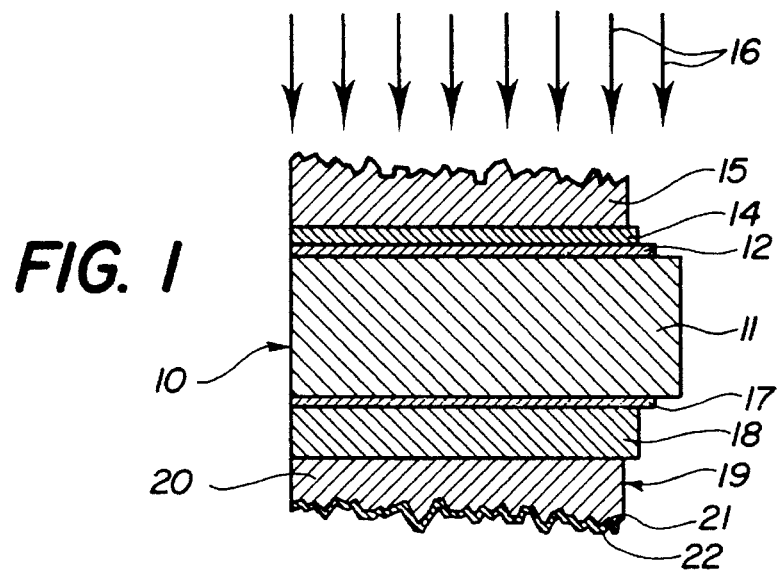
FIG. 1 is a schematic cross-section of a photovoltaic cell made in accordance with the invention, obtained using a smooth substrate.

With reference to FIG. 1, the photovoltaic cell 10 essentially comprises a substrate 11 having on one surface a front passivation layer 12, an emitter layer 14, and a transparent conductive layer 15; and on its other surface, a rear passivation layer 17, a rear layer 18 producing a back surface field, and a reflective element 19. Light beams 16 reach the photovoltaic cell on the side with the front transparent conductive layer 15.

The substrate 11 is made of crystalline silicon and, in the embodiment described, it is about 80 μm thick. The front passivation layer 12 is obtained by depositing a layer of intrinsic amorphous hydrogenated silicon about 80 Å thick on the front surface of the substrate. Next, an emitter layer 14 of hydrogenated microcrystalline silicon about 100 Å thick having n type conductivity (called the first conductivity type) in the example shown here, is deposited on this front passivation layer 12. A transparent conductive layer 15 (for example, zinc oxide, ZnO) with a textured surface formed by treating it with chemicals, plasma, or the like, is then deposited on the emitter layer 14. Because of its texture, this transparent conductive layer 15, which averages approximately 1000 Å thick, constitutes a "light trap". Incident light beams 16 perpendicularly striking the plane of cell 10 are deviated by refraction so that each beam actually follows a longer path through the cell. This increases the number of electron transitions and as a result, the number of electron/hole pairs, thereby improving cell output. It should be noted that this transparent conductive layer 15 may be made of any transparent conductor. Its thickness is selected so that it constitutes an anti-reflective layer for the range of wave lengths used. The application described uses optimum thickness for the solar spectrum.

The rear passivation layer 17 deposited on the rear surface of the substrate 11 is identical in composition and in thickness to the front passivation layer 12. The rear layer 18 which produces a back surface field is obtained by depositing hydrogenated microcrystalline silicon on the rear passivation layer 17. The conductivity of the rear layer 18 (called the second conductivity type) is the opposite of the emitter layer 14; in the present case, p type. The rear layer 18 is about 300 Å thick. Next, the three layers constituting the reflective element 19 are successively deposited on the rear layer 18. The first layer 20 of this reflective element is a transparent conductive layer which prevents light inside the cell from escaping by sending it back into the cell through the two junctions. This transparent conductive layer 20 is composed of zinc oxide (ZnO) and is about 2000 Å thick. To prevent light from escaping the cell, a reflective layer 22, which may be made of silver, for example, is deposited on an adhesion surface 21 obtained by the prior deposition of about a 15 Å layer of titanium on transparent layer 20. This reflective layer 22 also acts as a rear contact element.

Using silicon to form the rear passivation layer allows the formation of a rear contact with no intervention during deposition, in order to partially eliminate this passivation layer before depositing the layers constituting the reflective element.

In the embodiment described, the substrate 11 is conductive. This conductivity, which must be opposite to the conductivity of the emitter layer 14, is p type conductivity. However, note that it is possible to fabricate a similar photovoltaic cell by reversing all the conductivities. The substrate 11 and the rear layer 18 would thus have n type conductivity, while the emitter layer 14 would have p type conductivity.

Nevertheless, in other embodiments, the substrate may be compensated or intrinsic.

Figure 2:
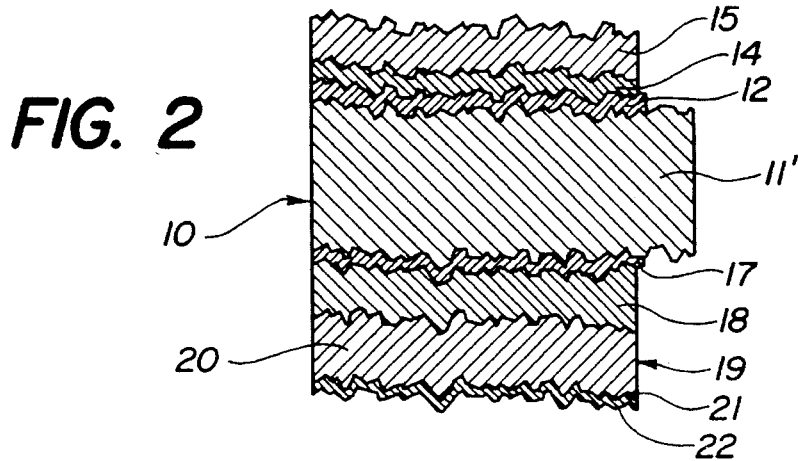
FIG. 2 is a schematic cross-section of a photovoltaic cell made in accordance with the invention, obtained using a textured substrate.

FIG. 2 shows an alternative embodiment of the invention wherein the substrate 11' is made of a material that is identical to that of the substrate 11 in FIG. 1, but has textured rear and front surfaces. The front passivation layer 12, rear passivation layer 17, emitter layer 14, and rear layer 18 producing a surface field, are similar to those described with reference to FIG. 1 In this embodiment, the front transparent conductive layer 15 and the rear transparent conductive layer 20 also are of uniform thickness. Thus, the outer most surfaces of the completed cell are textured, like the outer most surfaces of the cell shown in FIG. 1.

Figure 3:
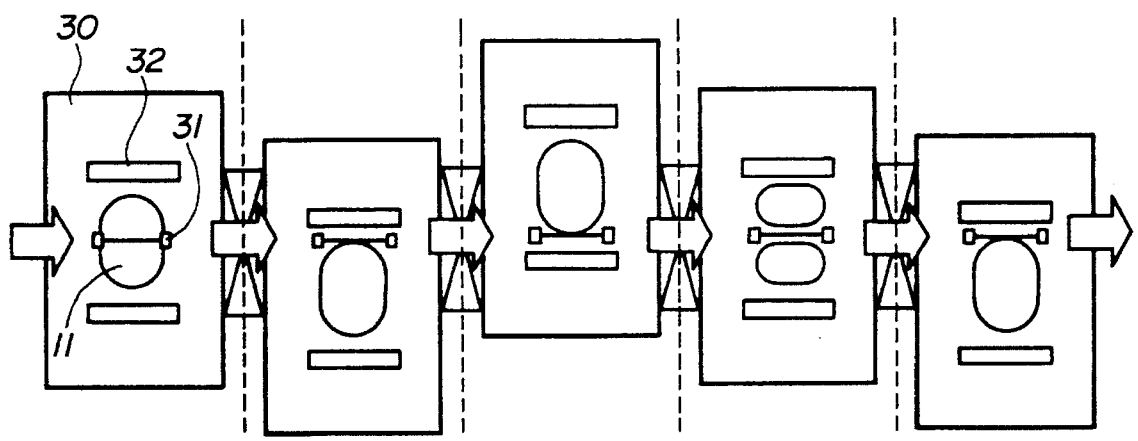
FIG. 3 shows the steps in the method of fabricating a photovoltaic cell according to the invention.

FIG. 3 shows the steps in the method of fabricating a photovoltaic cell according to the invention.

The first step is to place the substrate 11 in a deposition chamber 30 on a support 31 which allows both surfaces of the substrate to be simultaneously exposed to the etching and deposition elements 32.

Before being introduced into the deposition chamber, the substrate may have undergone a procedure known in the art which consists of etching with a chemical to remove layers of material that deteriorated during cutting. It may also be introduced as is. In this case, the first operation to take place consists of removing the deteriorated layer by subjecting it to plasma at a frequency of about 13.56 MHz on both substrate surfaces.

The second step in the procedure is optional. It consists of treating the substrate with plasma at a frequency ranging from 1 to 200 MHz, which texturizes the substrate surfaces. Of course, this step is only performed if one wishes to have the substrate texturized.

In the third step, the front passivation layer is deposited on the substrate. This deposition procedure, as well as the remaining procedures, is performed using very high frequency plasma deposition, as described in European Patent No. EP-A-0 263 788, preferably with a frequency of about 70 MHz.

Next, the emitter layer 14, rear passivation layer 17, the rear layer 18 are deposited.

A fourth step, which uses a vaporizing method known in the art, such as magnetron cathode sputtering at a frequency of about 13.56 MHz, consists of depositing the transparent front conductive layer 15 and the layers forming the reflective element 19. If the substrate is smooth, the conductive layers having a textured surface are deposited. Conversely, if the substrate is textured, the conductive layers are formed having essentially uniform thickness.

The advantage of this procedure is that the steps can be performed without intermediate manipulation of the substrate, once it is introduced into the deposition chamber, even when the substrate is introduced directly after cutting. This not only saves time over conventional fabrication methods wherein the substrates must be manipulated during formation, but it also permits the use of particularly delicate substrates, as the risk of breakage during such manipulation decreases.

The photovoltaic cell described above offers a number of advantages over prior art cells:

because the substrate used is particularly thin, it uses very little material;

because the entire procedure takes place at a low temperature, hardly any impurities diffuse from the deposition chamber where fabrication occurs. Thus, cleaning the substrate is simple and economical and does not affect cell efficiency, in contrast to known systems which require more complex, expensive cleaning. Furthermore, this method eliminates the risk of bending delicate substrates, thus reducing waste;

the substrate may be either monocrystalline or polycrystalline, may have either p or n type conductivity, and may be either intrinsic or compensated, with no change in the production method. This means that low quality base material can be used without ultimately affecting cell output, which is particularly economical;

using the known high frequency plasma deposition method (VHF method at a general frequency of about 70 MHz) decreases damage to and near the surface caused by bombardment with high energy particles generated by plasma deposition at the usual frequency of about 13.56 MHz. Deposition of the emitter layer and rear layer yields layers with a lower activation energy than with other methods. Thus, these layers react more favorably. Deposition of the doped microcrystalline layers results in higher conductivity than prior art methods. This reduces serial resistance in the cell and increases its output;

front and rear passivation layers decreases the speed at which the minority charge carriers recombine at the surface, resulting in higher voltage in the open circuit and therefore, higher output;

deposition of the emitter layer with microcrystalline silicon reduces absorption of the wave lengths belonging to the visible spectrum in contrast to emitter layers doped with amorphous silicon.

Wherefore, I claim:

1. A photovoltaic cell, comprising:

a semiconductor substrate having opposed front and rear surfaces;

a front passivation layer deposited on the front surface of the substrate;

an emitter layer formed over the front passivation layer having a first conductivity type (p or n);

a front transparent conductive layer formed over the emitter layer;

a rear passivation layer deposited on the rear surface of the substrate;

a rear layer formed over the rear passivation layer having a second conductivity type (p or n) opposite that of the emitter layer, said rear layer producing a back surface field; and a reflective element over the rear layer and comprising a rear transparent conductive layer, an adhesion layer formed on the transparent conductive rear layer, and a reflective layer secured to the adhesion layer.

2. A photovoltaic cell as claimed in claim 1, wherein the substrate has the second conductivity type (n or p).

3. A photovoltaic cell as claimed in claim 1, wherein the substrate is intrinsic.

4. A photovoltaic cell as claimed in claim 1, wherein the substrate is compensated.

5. A photovoltaic cell as claimed in claim 1, wherein the substrate is crystalline silicon and is from about 50 μm to about 150 μm thick.

6. A photovoltaic cell as claimed in claim 1, wherein the substrate is crystalline silicon and is about 80 μm thick.

7. A photovoltaic cell as claimed in claim 1, wherein the emitter layer is selected from the group consisting of hydrogenated microcrystalline silicon and hydrogenated silicon carbide, and is from about 20 Å to about 500 Å thick.

8. A photovoltaic cell as claimed in claim 7, wherein the emitter layer is about 100 Å thick.

9. A photovoltaic cell as claimed in claim 1 wherein the front passivation layer is amorphous hydrogenated intrinsic silicon and is from about 20 Å to about 500 Å thick.

10. A photovoltaic cell as claimed in claim 9, wherein the front passivation layer is about 80 Å thick.

11. A photovoltaic cell as claimed in claim 1, wherein the front transparent conductive layer is zinc oxide (ZnO) and is from about 500 Å to about 5000 Å thick.

12. A photovoltaic cell as claimed in claim 11, wherein the front transparent conductive layer is about 1000 Å thick.

13. A photovoltaic cell as claimed in claim 1, wherein the rear passivation layer is amorphous hydrogenated intrinsic silicon and is from about 20 Å to about 500 Å thick.

14. A photovoltaic cell as claimed in claim 13, wherein the rear passivation layer is about 80 Å thick.

15. A photovoltaic cell as claimed in claim 1, wherein the rear layer is hydrogenated microcrystalline silicon and is from about 100 Å to about 1000 Å thick.

16. A photovoltaic cell as claimed in claim 15, wherein the rear layer is about 300 Å thick.

17. A photovoltaic cell as claimed in claim 1, wherein the rear transparent conductive layer is heavily doped zinc oxide (ZnO) and is from about 500 Å to about 5000 Å thick.

18. A photovoltaic cell as claimed in claim 17, wherein the rear transparent conductive layer is about 2000 Å thick.

19. A photovoltaic cell as claimed in claim 1, wherein the adhesion layer is titanium (Ti) and is from about 10 Å to about 100 Å thick.

20. A photovoltaic cell as claimed in claim 19, wherein the adhesion layer is about 15 Å thick.

21. A photovoltaic cell as claimed in claim 1, wherein the reflective layer is silver and is about 2000 Å thick.

22. A photovoltaic cell as claimed in claim 1, wherein the front transparent conductive layer and the rear transparent conductive layer are textured and the substrate is generally smooth.

23. A photovoltaic cell as claimed in claim 1, wherein the substrate is textured and the front transparent conductive layer and the rear transparent conductive layer are of substantially uniform thickness.

24. A method for making a photovoltaic cell, comprising:

placing a semi-conductive substrate in a deposition chamber;

depositing in succession a front passivation layer and an emitter layer, said deposition accomplished by plasma deposition at a frequency from about 35 MHz to about 200 MHz;

depositing in succession a rear passivation layer and a rear layer, said deposition accomplished by plasma deposition at a frequency from about 35 MHz to about 200 MHz;

depositing a front transparent conductive layer and a rear transparent conductive layer, said deposition accomplished by magnetron cathode sputtering at a radio frequency from about 1 MHz to about 100 MHz; and depositing in succession an adhesion layer and a reflective layer on the rear transparent conductive layer.

25. A method as claimed in claim 24, wherein the plasma deposition is at a frequency of about 70 MHz.

26. A method as claimed in claim 24, wherein the magnetron cathode sputtering is-at a radio frequency of about 13.56 MHz.

27. A method as claimed in claim 24, further comprising:

etching the substrate with plasma at a frequency from about 1 MHz to about 200 MHz to provide the substrate with textured surfaces.

28. A method as claimed in claim 27, wherein the etching with plasma is at a frequency of about 70 MHz.

29. A method as claimed in claim 27, wherein the deposited layers have essentially uniform thickness.

30. A method as claimed in claim 24, wherein the front transparent conductive layer and the rear transparent conductive layer are textured and the semi-conductive substrate is generally smooth.

* * * * *

UNITED STATES PATENT AND TRADEMARK OFFICE
CERTIFICATE OF CORRECTION

PATENT NO. : 5,589,008
DATED : December 31, 1996
INVENTOR(S) : Herbert KEPPNER

It is certified that error appears in the above-identified patent and that said Letters Patent is hereby corrected as shown below:

Title page, section [73] Assignee: Replace Neuchatel, Canada with Neuchatel, SWITZERLAND.

Signed and Sealed this

Eighth Day of April, 1997

Attest:

BRUCE LEHMAN

Attesting Officer

Commissioner of Patents and Trademarks